US009490756B1

(12) United States Patent
Babic

(10) Patent No.: US 9,490,756 B1
(45) Date of Patent: Nov. 8, 2016

(54) PHASE-STIFF RF POWER AMPLIFIER FOR PHASED ARRAY TRANSMIT/RECEIVE MODULES

(71) Applicant: Eridan Communications, Inc., San Francisco, CA (US)

(72) Inventor: Dubravko Babic, Milpitas, CA (US)

(73) Assignee: Eridan Communications, Inc., San Francisco, CA (US)

( * ) Notice: Subject to any disclaimer, the term of this patent is extended or adjusted under 35 U.S.C. 154(b) by 0 days.

(21) Appl. No.: 14/997,640

(22) Filed: Jan. 18, 2016

(51) Int. Cl.
*H03F 3/217* (2006.01)
*H03F 1/56* (2006.01)
*H03F 3/19* (2006.01)

(52) U.S. Cl.
CPC *H03F 1/56* (2013.01); *H03F 3/19* (2013.01); *H03F 3/217* (2013.01); *H03F 2200/387* (2013.01); *H03F 2200/451* (2013.01)

(58) Field of Classification Search
CPC ............ H03F 1/56; H03F 3/19; H03F 3/217; H03F 2200/387; H03F 2200/451
USPC .................. 330/9, 192, 207 A, 251; 327/365
See application file for complete search history.

(56) References Cited

U.S. PATENT DOCUMENTS 4,682,176 A * 7/1987 Jones ........................ G01S 7/03 333/17.3
5,289,142 A * 2/1994 Upton ..................... G01S 7/034 327/237
2008/0278407 A1* 11/2008 Marrocco ................ H01Q 1/34 343/900
2014/0273888 A1* 9/2014 Levinger .................. H04B 1/44 455/78

OTHER PUBLICATIONS

MAEA-009445-000000 X-Band Phased Array Transmit/Receive Module (TRM), 2009 Data Sheet v2, Cobham Sensor Sytems, Featherstone, Wolverton MIII, Milton Keynes MK12 5EW.*
Solutions for Transmit/Receive Module Test, Reach for unrivaled excellence in TR module testing, Keysight Technologies, 2014, Published in USA, Aug. 4, 2014, 5991-3765EN, www.keysight.com.*

* cited by examiner

*Primary Examiner* — Steven J Mottola
*Assistant Examiner* — Hafizur Rahman
(74) *Attorney, Agent, or Firm* — Patent Law Professionals, P.C.; William E. Winters

(57) ABSTRACT

A phase-stiff radio frequency power amplifier (RFPA) is disclosed. The high phase-stiffness property of the RFPA obviates the need for a circulator or other isolation device in applications where the RFPA is used to implement the high-power amplifier in a transmit-receive module (TRM) configured for use in a phased array. The phase-stiff RFPA is designed to operate in switch-mode, resulting in high energy efficiency. Together, the high energy efficiency and high phase-stiffness attributes of the RFPA afford the ability to construct a phased array having a SWaP (Size, Weight and Power) performance that far surpasses that which can be possibly achieved in a phased array constructed from conventional TRMs.

23 Claims, 12 Drawing Sheets

US 9,490,756 B1

PHASE-STIFF RF POWER AMPLIFIER FOR PHASED ARRAY TRANSMIT/RECEIVE MODULES

STATEMENT REGARDING FEDERALLY SPONSORED RESEARCH OR DEVELOPMENT

This invention was made with Government support under Contract No. FA8750-14-C-0099 awarded by the Air Force Research Laboratory on behalf of DARPA. The Government has certain rights in the invention.

BACKGROUND OF THE INVENTION

Phased arrays are used in naval ships, military aircraft, and ground-based locations to detect and track targets, friend and foe, and to guide missiles to enemy targets. They are also used in various non-military applications such as, for example, commercial air and terrestrial traffic detection and control, satellite and space probe communications, weather research and forecasting, radio broadcasting, and cellular communications.

A phased array comprises an array of antenna elements configured to radiate a plurality of electromagnetic waves of different phases. The antenna elements are spatially separated but proximate, thereby allowing the plurality of electromagnetic waves to interfere, constructively or destructively, depending on their phase relationships, to form a radiation pattern or "beam." The direction of the beam (i.e., the "beam angle") can be varied (i.e., "steered"), if necessary or desired, by simply changing the phase relationships among the various electromagnetic waves radiated by the antenna elements. Modern phased arrays are "electronically scanned" arrays (ESAs), meaning that solid-state devices are employed to control the phase relationships among the electromagnetic waves. Using solid-state devices, the beam can be steered very rapidly, both in elevation and azimuth, thus allowing a large portion of the sky or space to be scanned quickly without having to move or alter the physical orientation of the antenna array.

In general, there are two different types of ESAs—the passive electronically scanned array (PESA) and the active electronically scanned array (AESA). PESAs operate by: (1) dividing a high-power radio frequency (RF) signal generated by a single high-power microwave generator (such as produced by a klystron, magnetron, or traveling wave tube) into a plurality of high-power RF signals, (2) selectively delaying some of the divided high-power RF signals, and (3) finally, coupling the delayed and un-delayed high-power RF signals to a plurality of associated antenna elements. AESAs are more state-of-the-art, employing a high-power amplifier (HPA) in each transmit path to amplify a low-power RF source to higher power (rather than relying on a klystron or other similar large, high-power microwave generator to generate the high RF transmit power). AESAs also exploit the high-frequency capability and small form factor offered by modern integrated circuit technology, thereby allowing, for each antenna element, the HPA in the transmit path and front-end of the receive path to be assembled together in a single transmit-receive module (TRM).

FIG. 1 is a drawing showing how a plurality of TRMs 102 is configured in a conventional AESA 100. Each TRM 102 has an associated antenna element 104, which is used for both transmitting and receiving. During transmitting, a beamformer 106 divides a low-power RF transmit signal provided by a low-power RF source 108 into a plurality of low-power RF transmit signals for the transmit paths of the TRMs 102. The beamformer 106 also serves to set and control the individual amplitude and phase of each of the low-power RF transmit signals, in order to affect the direction of transmission (i.e., beam angle) of the final high-power RF beam that is ultimately radiated by the AESA 100. The amplitude and/or phase-adjusted RF transmit signals are converted to higher RF power by the HPAs 112 (which are configured for Class-A, B or AB operation). Finally, the high-power RF transmit signals are transduced into high-power electromagnetic waves by the antenna elements 104 and radiated into the air or space, where they then interfere to form the final high-power RF beam.

When receiving, the antenna elements 104 capture electromagnetic energy from impinging electromagnetic waves and convert the captured electromagnetic energy into low-power RF electrical signals. Because the electromagnetic energy captured by the antenna elements 104 is usually very weak, the received RF electrical signals must be amplified by LNAs 114 before they can be further processed downstream. The LNAs 114 are designed for low noise figure and are incapable of handling high input powers. Accordingly, to protect the LNAs 114 from being damaged and prevent receiver desensitization, the received RF signals are passed through limiters 116 before being directed into the inputs of the LNAs 114. Note that the amplitudes and/or phases of the received RF signals can also be adjusted by the beamformer 106 during receiving in order to adjust the receive array pattern.

One serious problem associated with the conventional TRM 102 is that the high-power RF transmit signal produced by its HPA 112 can be reflected by the TRM's antenna element 104 and back toward the output of the HPA 112, instead of being fully transduced and radiated into the air or space by the antenna element 104. The reflected RF signal is highly undesirable since it can distort the RF transmit signal being produced by the HPA 112 and cause its phase to deviate from its intended phase, either due to the reflected RF signal reflecting, once again, from the output port of the HPA 112 and combining with the intended RF transmit signal or by entering into the HPA 112 through the HPA's output port, which can give rise to intermodulation distortion. Another serious and related problem associated with the conventional TRM 102 is that when the TRM 102 is configured in an array, along with other TRMs, as in FIG. 1, RF signals transmitted from an antenna element 104 of one TRM 102 can be undesirably intercepted by antenna elements 104 of other TRMs 102 in the array. These "reverse" signals are also highly undesirable since they can be passed into the intercepting TRM's transmit path and also distort the RF transmit signal being produced by the HPA 112.

In an effort to prevent these problems from happening, circulators must be employed in the conventional TRM 102. In other words, as illustrated in FIG. 1, each TRM 102 of the AESA 100 must be equipped with its own circulator 118. A circulator 118 is a three-port device having a first port connected to the output of the HPA 112 (transmit path port) of its associated TRM 102, a second port connected to the TRM's antenna element 104 (antenna port), and a third port connected to the input of the receive path of the TRM 102 (receive path port). A two-port component with similar properties is an isolator, which transmits RF power from one port to a second, while blocking transmission in the opposite direction. The directional properties of the circulator 118 (and isolator) are asymmetric (i.e., are non-reciprocal). This asymmetry is exploited and relied on in the conventional TRM 102 to prevent reflected transmit signals and reverse signals received from other TRMs from being directed into the transmit path of the HPA 112. When a TRM 102 is transmitting, its circulator 118 provides a low-loss path for signals directed from the circulator's transmit path port to its antenna port, thereby allowing transmitting to occur, but isolates the transmit port from the antenna port in the reverse direction, for example, by attenuating signals (such as reflected signals or reverse signals) flowing in the reverse direction.

Although the circulator 118 in each TRM 102 can help to prevent reflected and reverse signals from entering the transmit path, the isolation it provides is only effective over a very narrow range of frequencies. This narrowband limitation of the circulator and/or isolator is highlighted in FIGS. 2A and 2B, which are scattering parameter measurements taken on a typical isolator. FIG. 2A shows the forward transfer coefficient (scattering parameter (S-parameter) $s_{21}$) of the isolator swept over a 900 MHz to 1 GHz frequency range. FIG. 2B shows the reverse transfer coefficient (S-parameter $s_{12}$) of the isolator swept over the same frequency range. As can be seen in FIG. 2A, the forward transfer coefficient $s_{21}$ remains flat and near 0 dB (~−0.27 dB) over the entire swept frequency range, indicating that for the forward direction, if a circulator with such characteristics was to serve as one of the circulators 118 in one of the TRMs 102 of the phased array system 100 in FIG. 1, it would be effective at delivering most of the power from port 1 (attached to transmit path port) to port 2 (attached to antenna port). However, FIG. 2B reveals that the reverse transfer coefficient $s_{12}$ provides high isolation in the reverse direction only over a very narrow isolation bandwidth of ~30 MHz.

One of the advantages of the AESA over the PESA is that because the TRMs 102 are independent, they can potentially be operated at different frequencies. In theory, this frequency division possibility would allow the AESA 100 to track more than one target at a time; allow it to produce a radiation pattern having a lower probability of intercept compared to if only a single frequency was used; and allow it to thwart jammers by employing a number or sequence of frequencies that is difficult or nearly impossible for a potential jammer to predict. Unfortunately, due to the limited reverse isolation capability offered by circulators, these various advantages of the AESA cannot be fully realized. It should be mentioned that this limited reverse isolation characteristic is not only a problem particular to radar applications, it is also a problem in circumstances where the AESA 100 is being used for data communications since distortion that results by not being able to isolate the output of the HPAs 112 from reflected and reverse signals can make it difficult, and in some cases even impossible, to satisfy signal accuracy requirements imposed by applicable communications standards.

In addition to its limited reverse isolation capability, circulators are large passive devices that consume power, occupy large areas of the printed circuit board (PCB) on which they and other components of the TRMs 102 are formed, and add to the overall weight and size of the AESA 100. As can be seen in FIG. 3, in a typical TRM 300 the circulator 304 and associated PCB waveguide traces occupy nearly a third of the area of the PCB 302. Moreover, because the HPA 112 of the TRM 102 is a linear amplifier, it is large in size and very energy inefficient. A large heatsink 306 is therefore required to conduct heat away from the HPA 112 and protect it from being damaged, and a larger power supply than desired is required to compensate for the HPA's low energy efficiency. The large circulator 304 and large heatsink 306 of each TRM 102 also have a substantial effect on the cost, size and weight of the AESA 100, when considered as a whole. An AESA will often include hundreds and sometimes thousands of TRMs, so the incremental cost, size and weight of each TRM must be multiplied by hundreds or thousands of times in determining the overall cost, size and weight of the AESA as a whole. Furthermore, with hundreds and possibly thousands of very inefficient linear HPAs involved, large, heavy and expensive cooling systems are necessary to displace the enormous amount of heat generated by the hundreds and possibly thousands of HPAs.

From the foregoing remarks it should be clear that while the need for circulators in conventional TRMs is necessary, their inclusion introduces a number of other very significant problems. It should also be clear that a primary reason why a circulator 118 is needed in the conventional TRM 102 is to isolate the HPA 112 and prevent its output from being exposed to reflected and reverse signals. Without the circulators 118 (or some other type of isolation devices) in the TRMs 102, the reflected and reverse signals would distort the RF transmit signals produced by the HPAs 112 and, depending on the level of distortion, render the AESA 100 dysfunctional and possibly even entirely inoperable. It would be desirable, therefore, to have an HPA for a TRM which when configured for operation in an AESA operates without the need for a circulator or other isolation device and produces an RF output that is resilient and substantially immune to the presence of reflected and reverse signals. It would also be desirable for such an HPA to be capable of providing this resiliency over a wide range of operating frequencies. The present invention is directed at an HPA that has these desired attributes.

BRIEF SUMMARY OF THE INVENTION

A phase-stiff radio frequency power amplifier (RFPA) and methods of its implementation and operation are disclosed. The high phase-stiffness property of the RFPA obviates the need for a circulator or other isolation device in applications where the RFPA is used to implement the high-power amplifier in a transmit-receive module (TRM) configured for use in a phased array. The phase-stiff RFPA is also designed to operate in switch-mode, resulting in high energy efficiency. Together, the high energy efficiency and high phase-stiffness attributes of the disclosed RFPA afford the ability to construct a phased array having a SWaP (Size, Weight and Power) performance that far surpasses that which can be possibly achieved in a phased array constructed from conventional TRMs.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 4:
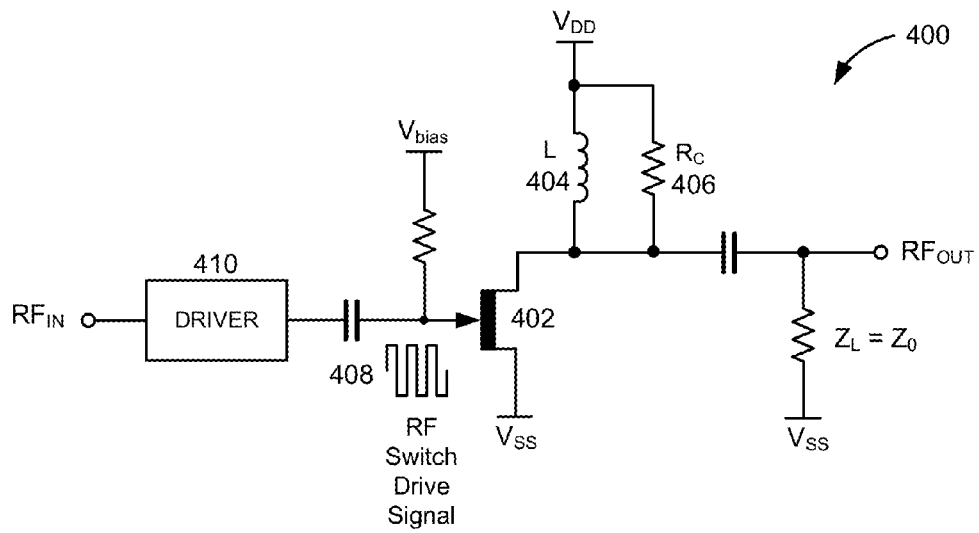
FIG. 4 is a schematic drawing of a phase-stiff radio frequency power amplifier (RFPA), in accordance with one embodiment of the invention.
Figure 5:
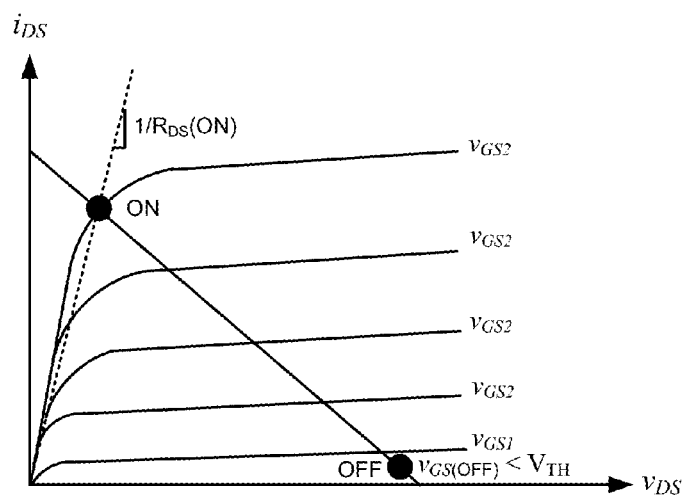
FIG. 5 are simplified drain-source current $i_{DS}$ versus drain-source voltage $v_{DS}$ characteristics curves of a power transistor, highlighting its switch-mode operation.

Referring to FIG. 4, there is shown a schematic drawing of a radio frequency power amplifier (RFPA) 400, according to an embodiment of the present invention. The RFPA 400 comprises a power transistor 402, an inductor 404, and a phase-stiffness-enhancing resistor 406. The RFPA 400 is configured to operate as a switch-mode power amplifier (SMPA), meaning that the power transistor 402 is driven by an RF switch drive signal 408 which forces the RFPA 400 to switch between conducting (ON) and blocking (OFF) states, as illustrated in the drain-source current $i_{DS}$ versus drain-source voltage $v_{DS}$ characteristics curves of the power transistor 402 in FIG. 5. Depending on the application, the RF switch drive signal 408 may or may not be frequency or phase modulated. The two capacitors in the drawing serve as DC blocking capacitors, which are used to separate the DC operating currents and voltages from the external circuitry. They are common in these circuits and are optional, depending on the design of a specific circuit.

Before continuing, it should be emphasized that, whereas the primary motivation for the RFPA 400 relates to its use in a transmit-receive module when configured in a phased array, the RFPA 400 may be used in any application in which a phase-stiff RFPA is needed or required.

The RF switch drive signal 408 is provided by a driver 410, which is preferably, though not necessarily integrated in the same integrated circuit as the power transistor 402. The driver 410 can be implemented using a variety of different circuit topologies. Two exemplary drivers that could be used to drive the RFPA 400 may be found in commonly owned and assigned U.S. patent application Ser. No. 14/743,046, entitled "Current Enhanced Driver for High-Power Solid-State Radio Frequency Power Amplifiers" and U.S. patent application Ser. No. 14/447,452, entitled "Limiting Driver for Switch ModePower Amplifier," both of which are incorporated herein by reference.

To support both high-power and high-frequency operation, in one embodiment of the invention the driver 410 and power transistor 402 are both fabricated using gallium nitride high electron mobility transistors (GaN-HEMTs) and integrated together in a single monolithic microwave integrated circuit (MMIC). While the driver 410 and RFPA 400 are both preferably made from GaN-HEMTs, either or both the driver 410 and RFPA 400 could be constructed using other types of solid-state devices and/or other types of semiconducting materials. Also, the driver 410 and RFPA 400 could be alternatively manufactured in two separate MMICs, rather than in a single MIMIC.

The inductor 404 in the RFPA 400 serves as an RF choke, allowing the DC power from the drain power supply to pass to the drain of the power transistor 402 while blocking RF signals generated by the power transistor 402 from entering the drain power supply. At RF frequency, the inductor presents a high impedance to the transistor. Depending on the application, the drain power supply may be designed to provide a fixed DC power supply or may be designed to provide a time varying (i.e., "dynamic") power supply (DPS), for example, to facilitate envelope modulation in a polar amplifier application. Another benefit of providing a DPS is that when the RFPA 400 is configured in a transmit-receive module (TRM), the amplitude of the RF output produced by the RFPA 400 can be controlled by adjusting the DPS, thus obviating the need for attenuators, which are typically employed in the transmit paths of conventional TRMs to control the RF output amplitude.

Figure 6:
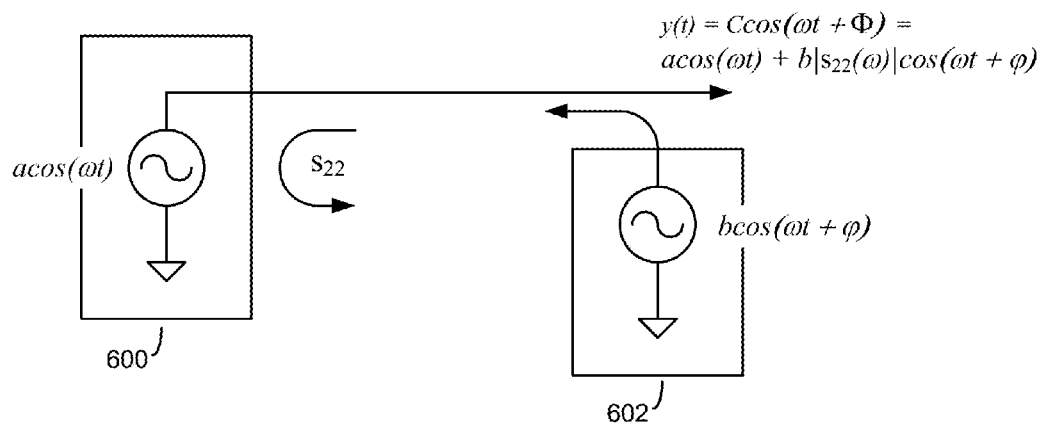
FIG. 6 is a drawing illustrating how the RF output of an RFPA can be affected by a disturbing signal.

The phase-stiffness-enhancing resistor 406 connected in parallel with the inductor 404 serves to enhance the phase stiffness of the RFPA 400. In general, the term "phase stiffness" describes how tolerant an RFPA is to a disturbing signal, such as a "reflected" and/or "reverse" signal, in situations where the RFPA is configured in a TRM and operating in a phased array. FIG. 6 is drawing that helps illustrate this concept of "phase stiffness." Without any disturbing signal present, the representative RFPA 600 would produce a desired RF output signal $a \cdot \cos(\omega t)$ having no phase error. However, when a disturbing signal $b \cdot \cos(\omega t + \phi)$ from a disturbing source 602 is present and directed toward the output of the RFPA 600, the actual signal produced by the RFPA 600 becomes:

$$y(t)=C \cdot \cos(\omega t+\Phi)=a \cdot \cos(\omega t)+b \cdot |s_{22}(\omega)| \cdot \cos(\omega t+\phi) \quad (1),$$

where $|s_{22}(\omega)|$ is the magnitude of the frequency dependent output reflection coefficient $s_{22}$ of the RFPA 600. The disturbing signal $b \cdot \cos(\omega t + \phi)$, thus changes the magnitude from the desired magnitude a to C and the desired phase from 0 to $\Phi$.

From Equation (1), it can be shown that the phase excursion $\Delta\Phi$ of the composite signal $y(t)=C\cdot\cos(\omega t+\Phi)$ due to the presence of the disturbing signal $b\cdot\cos(\omega t+\phi)$ while $\phi$ changes from zero to 360°, is:

$$\Delta\Phi = 2\tan^{-1}\left(\max\frac{\left(\frac{b|s_{22}|}{a}\right)\sin(\varphi)}{1+\left(\frac{b|s_{22}|}{a}\right)\cos(\varphi)}\right) = 2\sin^{-1}\left(\frac{b|s_{22}|}{a}\right). \quad (2)$$

Using the Maclaurin series approximation $\sin^{-1}(x)\approx x+x^3/6$, Equation (2) can be simplified to:

$$\Delta\Phi \approx 2|s_{22}|\cdot\frac{b}{a}+\frac{1}{3}\left[\left(\frac{b|s_{22}|}{a}\right)^3\right]. \quad (3)$$

Since under most all operating conditions the magnitude b of the disturbing signal $b\cdot\cos(\omega t+\phi)$ will be much smaller than the magnitude a of the desired RF output signal $a\cdot\cos(\omega t)$, the second term in Equation (3) can be ignored, and the maximum phase excursion $\Delta\Phi$ can be approximated as:

$$\Delta\Phi \approx 2|s_{22}|\cdot\frac{b}{a}. \quad (4)$$

A phase-stiff RFPA will not be influenced by the disturbing signal and will have an RF output with a phase excursion $\Delta\Phi$ that is as low as possible and, ideally, zero. Equation (4) reveals that the maximum phase excursion $\Delta\Phi$ is directly proportional to the magnitude of the output reflection coefficient $|s_{22}|$. The magnitude of the output reflection coefficient $|s_{22}|$ can therefore be used as an indicator of how phase-stiff an RFPA is. The smaller the magnitude of the output reflection coefficient $|s_{22}|$, the more phase-stiff the RFPA likely is. One task involved in realizing a phase-stiff RFPA, then, is to the extent possible, minimizing $|s_{22}|$.

It should be mentioned that even in situations where it is possible to minimize $|s_{22}|$, that feat by itself does not necessarily guarantee a phase-stiff RFPA. An ideal phase-stiff RFPA would not only not reflect the disturbing signal (meaning $|S_{22}|=0$), it would also (2) not absorb the disturbing signal (meaning $|s_{22}|=1$). Although these two requirements are seemingly contradictory, the RFPA 400 of the present invention is able to come close to satisfying them both simultaneously. The RFPA 400 of the present invention is configured to operate as a SMPA, alternately switching ON and OFF according to the switch drive signal 408 applied to it by the driver 410. The output reflection coefficient $s_{22}$ thus changes in time between two values, $s_{22}(ON)$ and $s_{22}(OFF)$, and the signal $y(t)$ produced by the RFPA 400 in the presence of a disturbing signal $\sin(\omega t)$ can be written (assuming real reflection coefficients $s_{22}$, i.e., no reactive component and expanding the alternating reflection coefficient into a Fourier series) as:

$$y(t) = a\sin\omega t + b\frac{s_{22}^{(ON)}+s_{22}^{(OFF)}}{2}\sin(\omega t+\phi)+b\frac{4\cos(\phi)}{\pi}\left(\frac{s_{22}^{(ON)}-s_{22}^{(OFF)}}{2}\right) \quad (5)$$

$$\left\{\frac{1}{2}-\sum_{\substack{k=2\\even}}^{\infty}\frac{\sqrt{1+k^2\tan^2\phi}}{k^2-1}\cos[k\omega t+\tan^{-1}(k\tan\phi)]\right\}.$$

Equation 5 has three terms. The first term is the desired RF output signal $a\cdot\cos(\omega t)$. The second term includes the factor $(s_{22}(ON)+s_{22}(OFF))/2$, which represents the average or effective output reflection coefficient of the RFPA 400. The final term depends on the difference between the OFF and ON output reflection coefficients $s_{22}(OFF)$ and $s_{22}(ON)$ and the product of the sum of even harmonics of the carrier frequency $\omega$ and the DC contribution.

Assuming that the RFPA 400 switches like an ideal switch, the ON-state and OFF-state output reflection coefficients of the RFPA 400 are $s_{22}(ON)=-1$ (short circuit condition) and $s_{22}(ON)=1$ (open circuit condition). Accordingly, for an ideal switch, the second term is zero and the effective output reflection coefficient $\overline{s_{22}}=(s_{22}(ON)+s_{22}(OFF))/2=0$. The third term reveals that the disturbing signal is upconverted to even harmonics and downconverted to DC, and not absorbed by the RFPA 400. These even harmonics can be filtered out using known filtering techniques. With the second and third terms eliminated, the only term remaining is the first term, which is the desired RF output signal $a\cdot\cos(\omega t)$.

From the foregoing description it is clear that when the RFPA 400 is treated as an ideal switch, it satisfies the dual and seemingly contradictory requirements for a phase-stiff RFPA, that is that the RFPA: (1) not reflect the disturbing signal ($|s_{22}|=0$) and (2) not absorb the disturbing signal ($|s_{22}|=1$). The effective output reflection coefficient $\overline{s_{22}}=(s_{22}(ON)+s_{22}(OFF))/2=0$. This means that the disturbing signal is not reflected by the RFPA 400 and therefore cannot adversely affect the intended phase of the desired RF output signal $a\cdot\cos(\omega t)$. Ideally, the second requirement, $|s_{22}|=1$, is also satisfied. Even though the effective output reflection coefficient $\overline{s_{22}}=0$, none of the power in the disturbing signal is actually absorbed by the RFPA 400. Rather, Equation (5) reveals that the power is upconverted to even harmonics, instead, thus satisfying the $|s_{22}|=1$ requirement. Therefore, with both requirements satisfied, the RFPA 400, when treated as an ideal switch, exhibits ideal-like phase stiffness. It can be shown in a straightforward manner that the phase-stiffness and up/down conversion are preserved even if the disturbing wave is of frequency that is different but close to the carrier frequency.

In any practical application, the RFPA 400 will not, of course, operate as an ideal switch. This would require that the RFPA's power transistor exhibit zero resistance when turned ON and infinite resistance when turned OFF, which clearly cannot be satisfied in any practical power transistor. Nevertheless, even when the ideal conditions are dispensed with, the RFPA 400 still realizes a phase stiffness that is superior to any non-switched (i.e., "linear") power amplifier, such as a Class-A, B, AB or C power amplifier. This superior phase stiffness can be seen in the phase stiffness plot in FIG. 7. The phase stiffness plot compares the measured peak-to-peak phase excursion $\Delta\Phi$ experienced at the RF outputs of Class-A and Class-AB RFPAs to the peak-to-peak phase excursion $\Delta\Phi$ experienced at the RF output of a single-ended (SE) switch (like the RFPA 400 in FIG. 4 but without the phase-stiff enhancing resistor 406) for the same type and size power transistor and for different magnitudes b of the disturbing signal $b\cdot\cos(\omega t+\phi)$. For circumstances where the various power amplifiers serve as the RFPA in a TRM, the disturbing signal $b \cdot \cos(\omega t + \phi)$ is representative of a reflected or reverse signal that the output of the RFPA may be exposed to when the TRM is configured in a phased array. The phase stiffness plot shows that the Class-A and AB HPAs are 7 to 10 dB less tolerant to the disturbing signal over the entire range of applied disturbing signal strengths (−25 dB to 0 dB), and that the RFPA 400 (i.e., SE switch) is about 80% less sensitive to reflected and reverse signals than are the Class-A and Class-AB HPAs.

Figure 7:
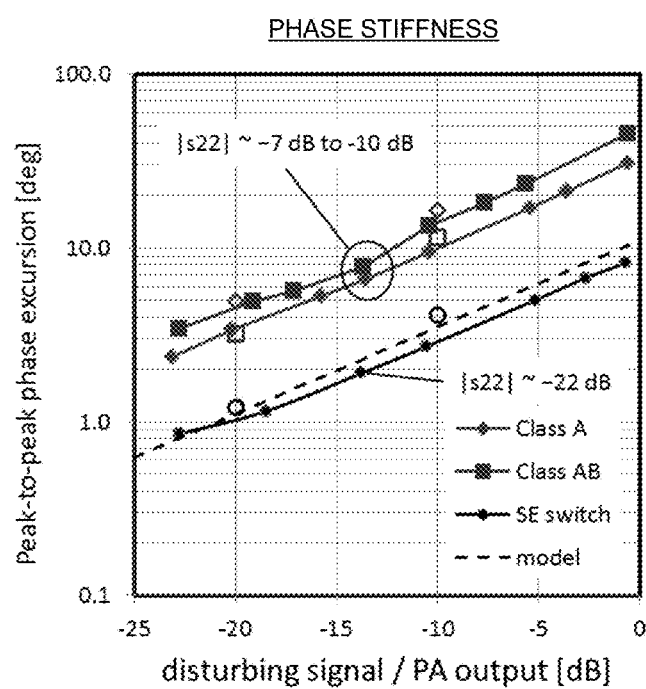
FIG. 7 is a phase-stiffness plot that compares the measured peak-to-peak phase excursion $\Delta\Phi$ experienced at the RF outputs of an unmatched Class-A and Class-AB RFPAs to the peak-to-peak phase excursion $\Delta\Phi$ experienced at the RF output of a single-ended (SE) switch (like the phase-stiff RFPA depicted in FIG. 4 but without the phase-stiff enhancing resistor) for the same type and size power transistor and for different magnitudes of a disturbing signal.

The phase-stiffness measurements for the RFPA 400 in FIG. 7 are for the case when no phase-stiffness-enhancing resistor 406 is being used (i.e., is absent). When the phase-stiffness-enhancing resistor 406 is present and connected across the inductor 404, as in FIG. 4, the phase stiffness of the RFPA 400 can be further enhanced. The process by which this phase stiffness enhancement is achieved will now be described.

When the power transistor 402 is turned ON, the output reflection coefficient $s_{22}(ON)$ of the RFPA 400 can be written:

$$s_{22}(ON)=(R_{ON}-Z_0)/(R_{ON}+Z_0) \qquad (6),$$

where $R_{ON}$ is the output impedance of the RFPA 400 when the power transistor 402 is switched ON and $Z_0$ is the impedance (typically 50Ω) of the load, which may be an antenna element of a TRM in circumstances where the RFPA 400 is used in a TRM of a phased array.

Similarly, when the power transistor 402 is turned OFF, the output reflection coefficient $s_{22}(OFF)$ of the RFPA 400 can be written:

$$s_{22}(OFF)=(R_{OFF}-Z_0)/(R_{OFF}+Z_0) \qquad (7),$$

where $R_{OFF}$ is the output impedance of the RFPA 400 when the power transistor 402 is switched OFF and, again, $Z_0$ is the impedance of the load.

In the output reflection coefficient equations in Equations 6 and 7, it is assumed that the ON-state and OFF-state output impedances of the RFPA 400 are purely resistive (i.e., have no reactive component). In other words, they assume that the impedance of the inductor 404 at all frequencies of interest is so high that it does not affect the output impedance of the RFPA 400, whether the power transistor 402 is ON or OFF, and that the drain-source capacitance $C_{DS}$ of the power transistor 402 is low enough that the impedance presented by the drain-source capacitance $C_{DS}$ does not significantly affect the output impedance, whether the power transistor 402 is ON or OFF. Knowing from Equation (5) above that in order to make the RFPA 400 phase-stiff, $s_{22}(ON)$ must be the negative of $s_{22}(OFF)$ (i.e., $s_{22}(ON)=-s_{22}(OFF)$), it can be determined from Equations (6) and (7) that this condition will only hold true if:

$$R_{ON}R_{OFF}=Z_0^2 \qquad (8).$$

Figure 8:
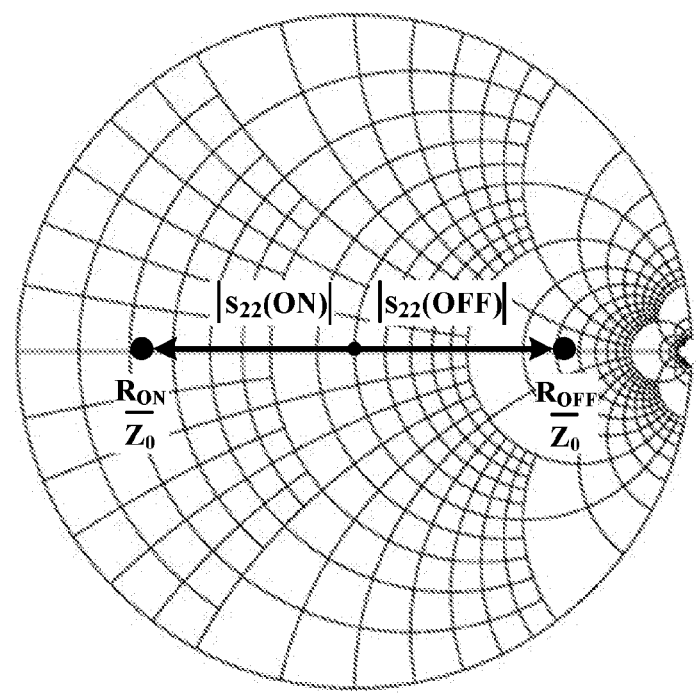
FIG. 8 is a Smith Chart upon which a real ON-state output reflection coefficient and a real OFF-state output reflection coefficient of the RFPA depicted in FIG. 4 are plotted.

The relationship in Equation (8) can also be visualized by referring to the Smith Chart in FIG. 8, where the ON-state output reflection coefficient of the RFPA 400 and the OFF-state output reflection coefficient of the RFPA 400 are plotted. The Smith Chart reveals that in order to achieve an effective output reflection coefficient of $\overline{s_{22}}=(s_{22}(ON)+s_{22}(OFF))/2\approx 0$ (representative of a phase-stiff RFPA), the normalized ON-state output impedance $R_{ON}/Z_0$ should be equal to the reciprocal of the normalized OFF-state impedance resistance $R_{OFF}/Z_0$. In other words, in order to make $s_{22}(ON)=-s_{22}(OFF)$, $R_{ON}/Z_0$ should equal $Z_0/R_{OFF}$.

The relationship in Equation (8) is the key to determining what the optimum resistance of the phase-stiffness-enhancing resistor 406 should be. When the relationship is satisfied, the first term in Equation (6), which represents the effective output reflection coefficient $\overline{s_{22}}$, is minimized, as desired, while the third term containing the upconverted even harmonics is maximized, which is also desired since it ensures that the disturbing signal is not absorbed by the RFPA 400 but rather is upconverted to even harmonics which can be easily filtered out using know filtering techniques.

When the RFPA 400 is switched ON and the phase-stiffness-enhancing resistor 406 is present (i.e., connected in parallel with the inductor 404 as shown in FIG. 4), the ON-state output impedance $R_{ON}$ of the RFPA 400 is determined by (i.e., is substantially equal to) the ON resistance $R_{DS}(ON)$ of the power transistor 402. The ON resistance $R_{DS}(ON)$ of a power transistor is generally well known, either being provided by the transistor manufacturer or easily determined by simple measurement. Additionally, the ON resistance $R_{DS}(ON)$ of a power transistor is very low, typically no more than a few ohms, and has a constant value when the power transistor is operated as a switch and switched ON. It should be noted that when the power transistor 402 is switched ON, the inductor 404, drain-source capacitance $C_{DS}$ of the power transistor 402, and phase-stiffness-enhancing resistor 406 are all also connected in parallel with the drain-source terminals of the power transistor 402 under AC conditions. Consequently, those components will also have an impact on the ON-state output impedance $R_{ON}$ of the RFPA 400. However, the impedance presented by each of those components is typically large compared to the very low ON resistance $R_{DS}(ON)$ of the power transistor 402 and therefore can be ignored. The ON-state output impedance $R_{ON}$ of the RFPA 400 can therefore be approximated to be: $R_{ON} \approx R_{DS}(ON)$.

Regarding the OFF-state output impedance $R_{OFF}$ of the RFPA 400, if the phase-stiffness-enhancing resistor 406 was not present the OFF-state output impedance $R_{OFF}$ would be determined by the OFF resistance $R_{DS}(OFF)$ of the power transistor 402 (ignoring the drain-source impedance of its drain-source capacitor $C_{DS}$ and the large impedance presented by the inductor 404). The OFF resistance $R_{DS}(OFF)$ of a power transistor is very large (typically >100 kΩ) but cannot be arbitrarily set or controlled, which would be necessary to satisfy the relationship in Equation (8) above in the absence of the phase-stiffness-enhancing resistor 406. However, with the phase-stiffness-enhancing resistor 406 present and connected in parallel with the inductor 404, as in FIG. 4, the OFF-state output impedance $R_{OFF}$ of the RFPA 400 is controllable and determined by the resistance $R_C$ of the phase-stiffness-enhancing resistor 406 (again, ignoring the drain-source impedance of its drain-source capacitor $C_{DS}$ and the large impedance presented by the inductor 404), not by the OFF resistance $R_{DS}(OFF)$ of the power transistor 402. The large OFF resistance $R_{DS}(OFF)$ of the power transistor 402 will still have some effect on the OFF-state output impedance $R_{OFF}$ of the RFPA 400 with the phase-stiffness-enhancing resistor 406 in place; however, because the large OFF resistance $R_{DS}(OFF)$ is connected in parallel with the phase-stiffness-enhancing resistor 406 (AC conditions) and the resistance $R_C$ of the phase-stiffness-enhancing resistor 406 will be a factor of ten or more times smaller than $R_{DS}(OFF)$ when the relationship in Equation (8) is satisfied, the large OFF resistance $R_{DS}(OFF)$ of the power transistor 402 can be ignored. Therefore, the OFF-state output impedance $R_{OFF}$ of the RFPA 400 is approximately $R_{OFF} \approx R_C$, and given that the ON-state output impedance of the RFPA 400 is $R_{ON} \approx R_{DS}(ON)$ (as just explained in the previous paragraph), the relationship in Equation (8) can be written as:

$$R_{DS}(ON) \cdot R_C = Z_0^2 \qquad (9)$$

where, again, $R_{DS}(ON)$ is the ON resistance of the RFPA's power transistor 402 when switched ON and $R_C$ is the resistance of the phase-stiffness-enhancing resistor 406.

Since $R_{DS}(ON)$ is fixed and known and the characteristic impedance $Z_0$ is fixed and known (typically 50Ω), the resistance $R_C$ of the phase-stiffness-enhancing resistor 406 required to maximize the phase stiffness of the RFPA 400 can be calculated from Equation (9). For example, for a power transistor having an $R_{DS}(ON)=2.5Ω$ and characteristic impedance $Z_0=50Ω$, the value of the resistance $R_C$ is determined to be $R_C=1.0$ kΩ.

A more rigorous analysis of the circuit shown in FIG. 4 shows that when the finite inductance of the inductor 404 and non-negligible drain-source capacitance $C_{DS}$ are taken into account, the optimal phase-stiffness-enhancing resistor still improves the performance. Specifically, the Equation (8) holds exactly when the inductor L and capacitor $C_{DS}$ reach parallel resonance because at that condition the resistances $R_{ON}$ and $R_{OFF}$ produce real reflection coefficients $s_{22}(ON)$ and $s_{22}(OFF)$. For the same reason, the effective $s_{22}$ is frequency dependent: It is near zero at the resonance and increases away from it. The result of this more rigorous analysis is also shown in FIG. 7 as "model", illustrating that the phase-stiffness can be theoretically predicted with reasonable accuracy.

Figure 9:
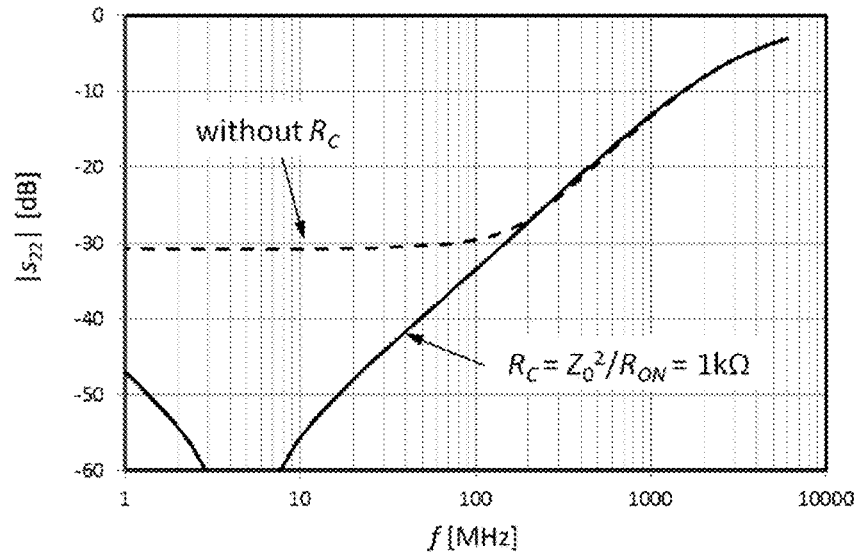
FIG. 9 is a plot of the phase stiffness of the RFPA depicted in FIG. 4 (expressed using the magnitude of the effective output reflection coefficient of $\overline{s_{22}}$) as a function of frequency, highlighting the phase-stiffness enhancement that results by incorporating the phase-stiffness-enhancing resistor in the RFPA (the lower $\overline{s_{22}}$ means better phase stiffness)

FIG. 9 is a plot of the phase stiffness of the RFPA 400 (expressed using the magnitude of the effective output reflection coefficient of $\overline{s_{22}}$) as a function of frequency, highlighting the phase-stiffness enhancement that can be achieved when the phase-stiffness-enhancing resistor 406 is incorporated into the RFPA 400. In this modeled result, the effects of the inductor 404 and drain-source capacitance $C_{DS}$ are accounted for (i.e., are not ignored). The specific case modeled has the inductor 404 having an inductance of L=1 mH, the drain-source capacitance $C_{DS}=0.7$ pF, and the ON resistance of the power transistor 402 equal to $R_{DS}(ON)=R_{ON}=2.5Ω$. The horizontal axis shows the carrier frequency f and the dip is centered around f=6 MHz, the resonance of L and $C_{DS}$. Without the phase-stiffness-enhancing resistor 406, the plot shows that $\overline{s_{22}}=-30$ dB over a three decade bandwidth. While that level of phase stiffness is respectable, it is not necessarily adequate for all situations. With the phase-stiffness-enhancing resistor 406 present, however, it is possible to reduce $\overline{s_{22}}$ to values approaching −60 dB, thus illustrating how the phase-stiffness-enhancing resistor 406 serves to enhance the phase stiffness of the RFPA 400 beyond what which may be referred to as the RFPA's 400's "natural" or "built-in" phase stiffness.

Figure 10:
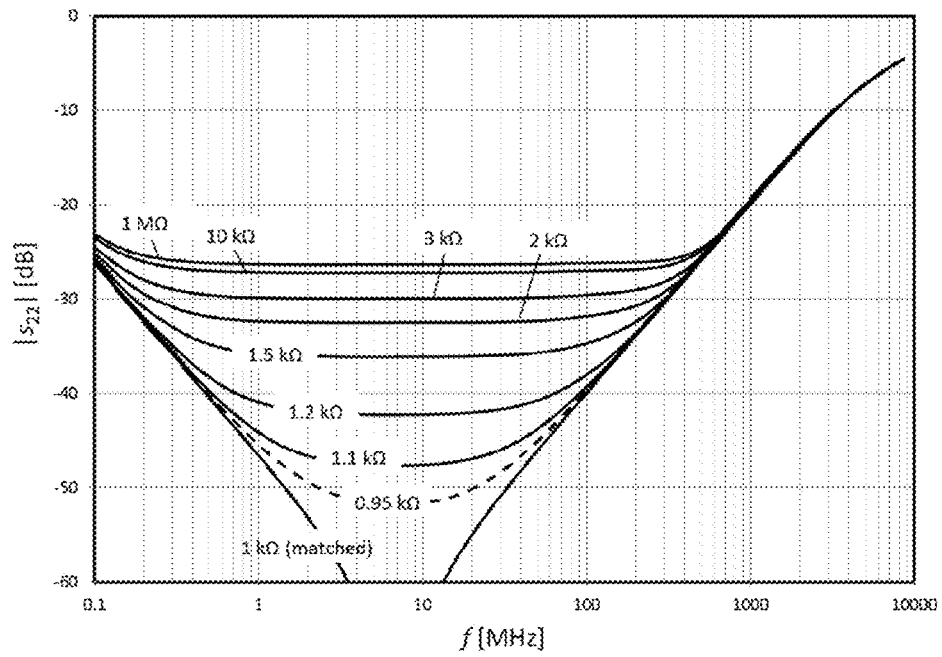
FIG. 10 is a plot of the phase stiffness of the RFPA depicted in FIG. 4 for different resistance values of the phase-stiffness-enhancing resistor.

The phase-stiffness plot in FIG. 10 further shows how the phase-stiffness bandwidth of the RFPA 400 is affected by the phase-stiffness-enhancing resistor 406. In this plot it is seen that for increasing resistances $R_C$ of the phase-stiffness-enhancing resistor 406, the phase-stiffness bandwidth widens but at the expense of lower phase stiffness. This dependency can be exploited in an actual application of the RFPA 400 by adjusting the resistance $R_C$ of the phase-stiffness-enhancing resistor 406 so that a desired combination of phase stiffness value and DC power dissipation on the phase-stiffness-enhancing resistor 406. The phase-stiffness-enhancing resistor 406 can also be adjusted in real time. The real-time adjustment capability would allow the phase stiffness of the RFPA 400 to be adjusted to higher phase-stiffness level (more negative values of $\overline{s_{22}}$ when expressed in decibels) during times when the RFPA 400 is being exposed to (or potentially could be exposed to) disturbances having a frequency (or frequencies) known to be close to the center frequency (8.6 MHz in the chart) and then be adjusted to lower phase-stiffness levels (more positive values of $\overline{s_{22}}$, again, when expressed in decibels) when the RFPA 400 needs to be phase-stiff over a wider range of frequencies. FIG. 10 uses L=1 mH, $C_{DS}=0.34$ pF, $R_{ON}=2.5Ω$, and $Z_0=50Ω$.

Figure 11A:
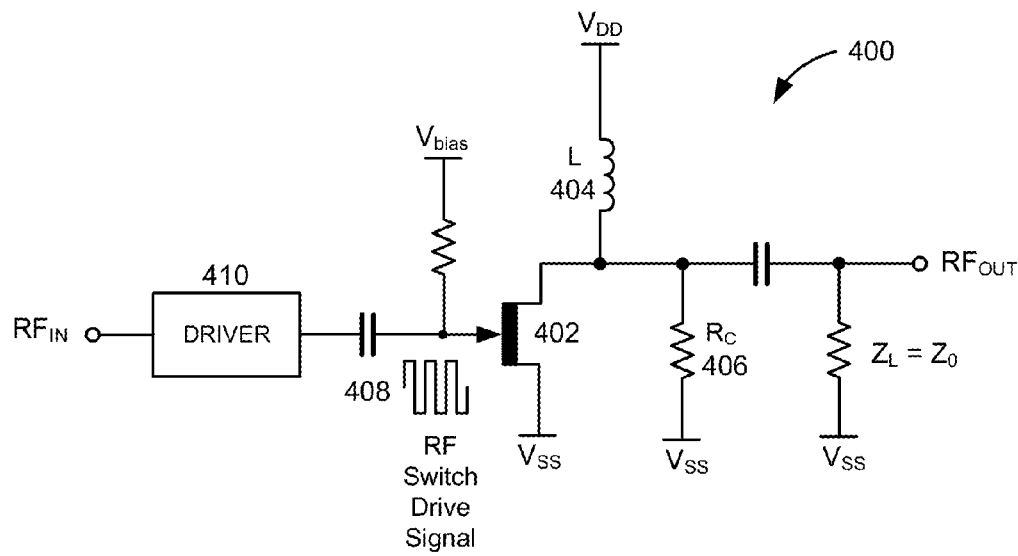
FIGS. 11A and 11B are schematic drawings of two variations of the RFPA depicted in FIG. 4, in accordance with two other embodiments of the invention.
Figure 11B:
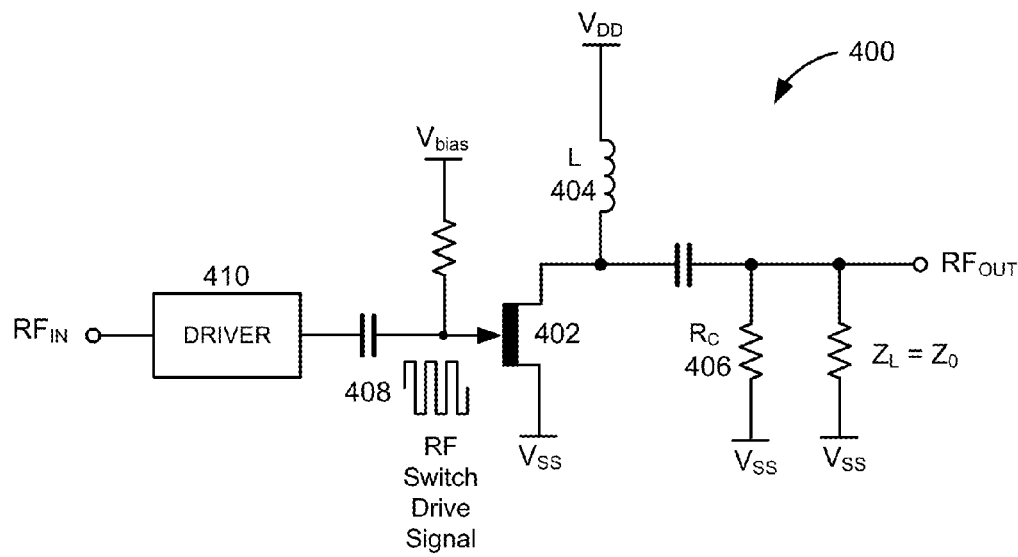

It should be mentioned that whereas the phase-stiffness-enhancing resistor 406 is physically connected across the inductor 404 in the embodiment of the RFPA 400 depicted in FIG. 4, it could be alternatively connected between the drain of the power transistor 402 and the source power supply voltage connection and on either side of the output AC coupling capacitor, as illustrated in FIGS. 11A and B. Although these two different physical connections of the phase-stiffness-enhancing resistor 406 are different from the physical connection of the phase-enhancing-resistor 406 shown in the embodiment of the RFPA 400 in FIG. 4, all three variations are equivalent when viewed under AC conditions. In other words, under AC conditions the phase-stiffness-enhancing resistor 406 for all three physical variations appears across the drain-source terminals of the power transistor 402. Although all three variations in the physical placement of the phase-stiffness-enhancing resistor 406 lead to the same ON-state and OFF-state output impedances discussed above, the physical placement of the phase-stiffness-enhancing resistor 406 can affect other performance characteristics of the RFPA 400. For example, if the phase-stiffness-enhancing resistor 406 is physically connected as shown in FIG. 11A, the phase-stiffness-enhancing resistor 406 will dissipate twice as much DC power compared to if it was physically connected as shown in FIG. 4 or in FIG. 11B. Accordingly, if minimizing the power dissipation of the phase-stiffness-enhancing resistor 406 is a main concern, the physical connection of the phase-stiffness-enhancing resistor 406 in FIG. 4 or FIG. 11B would be preferred. It is also advantageous to locate the phase-stiffness-enhancing resistor 406 so that it and the output (drain) of the power transistor 402 are equidistant from the load connection. That can be best accomplished by locating the phase-stiffness-enhancing resistor 406 as shown in FIG. 4.

Figure 12B:
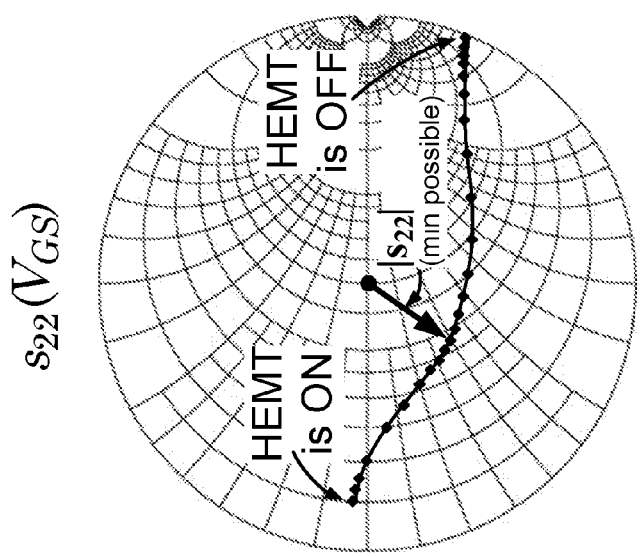
FIG. 12B is a drawing that includes a Smith Chart, illustrating how the output reflection coefficient a conventional Class-AB RFPA varies as a function of applied gate-voltage $V_{GS}$. (The data in FIG. 12B corresponds to the drain current shown in FIG. 12A.)
Figure 12A:
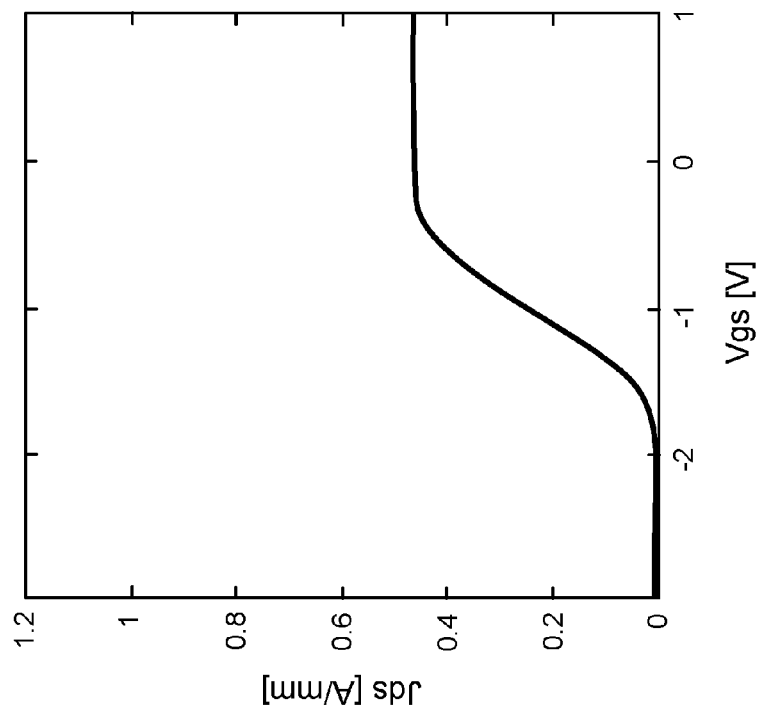
FIG. 12A is a plot of drain current $i_{DS}$ vs. $v_{GS}$ for a AlGaN/GaN HEMT at constant $v_{DS}$ voltage illustrating the gradual transition between conduction (far right) and blocking (far left) modes.

The natural phase-stiffness of the RFPA 400 follows from its operation as switch, which produces an effective output reflection coefficient $\overline{s_{22}} = (s_{22}(ON)+s_{22}(OFF))/2$. As should be clear from the description above, the RFPA's 400's phase stiffness can be enhanced beyond its natural phase stiffness, if desired, by manipulating the phase-stiffness-enhancing resistor 406 so that the effective output reflection coefficient $s_{22}$ is forced closer to zero. A linear RFPA, such as the linear HPA 112 in conventional TRM 100 depicted in FIG. 1, has poor phase stiffness that depends on the operating conditions. The $|s_{22}|$ of a linear amplifier can be reduced to close to zero using a matching network, but that works only for a very limited range of frequencies and still the value of $|s_{22}|$ varies depending on the operating conditions of the output transistor. The power transistor in a linear RFPA operates as a controlled current source, not as a switch, and with a drain-source resistance $R_{DS}$ and drain-source capacitance $C_{DS}$ that vary continuously over operating conditions, applied gate bias $V_{GS}$, drain power supply $V_{ds}$, and drain current $I_{DS}$. The gate bias dependency of the linear RFPA output reflection coefficient can be easily measured and is shown in the Smith Chart in FIG. 12B. As the output field-effect transistor moves from conducting state (ON) to blocking state (OFF) with continuously varying gate bias voltage $V_{GS}$ at constant $V_{DS}$, the drain current density JDS reduces from full conduction to being completely shut off in FIG. 12A, while for the same change in the gate bias voltage the output reflection coefficient $s_{22}$ varies at from near-short circuit ("HEMT is ON" point) to near-open circuit ("HEMT is OFF" point). As it passes through the Smith Chart it may passes close or through the origin where it would experience $s_{22}$=0. Reaching the origin, however, requires precise adjustment of operating conditions and if matching network is used to get to the origin, then it would occur only at a specific frequency.

It should be mentioned that even if $|s_{22}|$ could be manipulated and forced toward zero in the conventional linear RFPA, that would still not meet the second criterion for a phase-stiff RFPA, specifically, that a disturbing signal not be absorbed into the RFPA via its output. This second criterion is satisfied in the RFPA 400 of the present invention by virtue of its switch-mode operation, which has the effect of upconverting power present in the disturbing signal to even harmonics, rather than the power being absorbed through the output of the RFPA 400. The linear RFPA does not behave or respond in this manner, so the incident power in the disturbing signal that is not reflected at the output of the linear RFPA is absorbed by the linear RFPA, via its output, leading to the possibility of intermodulation distortion within the linear RFPA.

Figure 13:
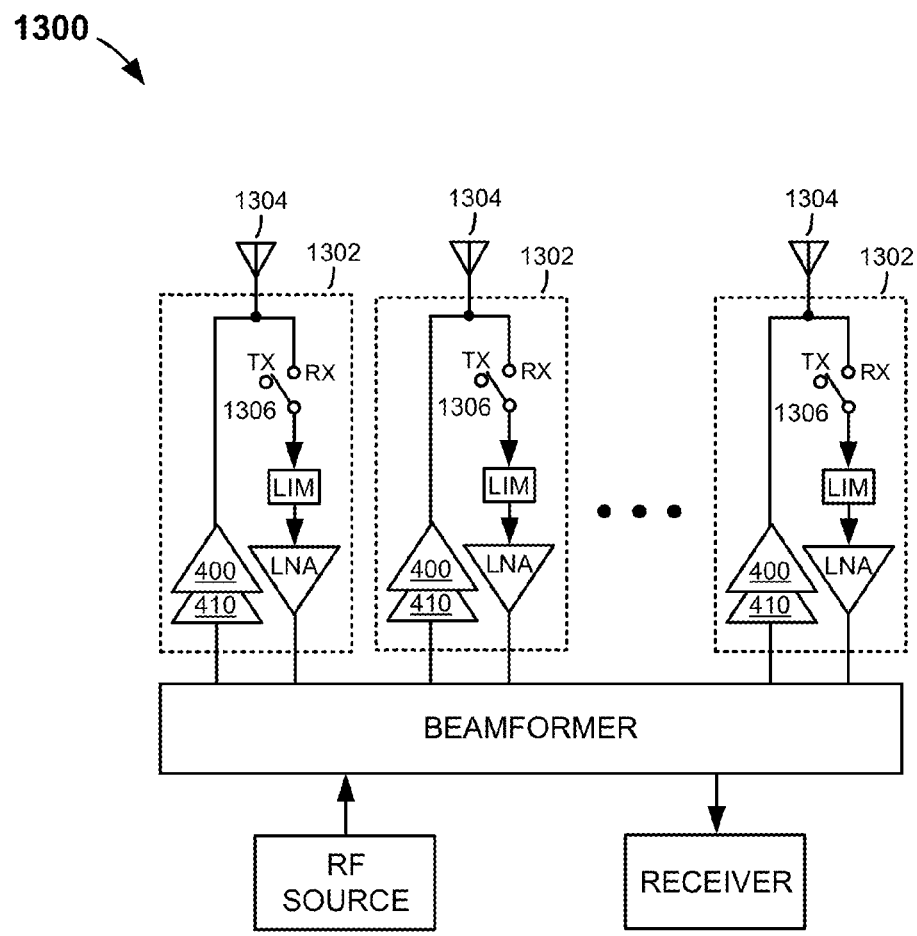
FIG. 13 is a drawing illustrating how a plurality of TRMs, each including an RFPA similar to the RFPA depicted in FIG. 4, may be configured in a phased array.

Due to the extraordinary phase stiffness of the RFPA 400 of the present invention, especially when enhanced by inclusion of the phase-stiffness-enhancing resistor 406, the RFPA 400 is able to tolerate essentially most any reflected or reverse signal that may be directed toward its output, i.e., is able to produce an RF transmit signal that is substantially undistorted by the reflected and reverse signals, despite their presence. When the RFPA 400 serves in a TRM configured in a phased array, the extraordinary phase stiffness capability of the RFPA 400 avoids any need for a large and bandwidth-restricting circulator (or other isolating device). FIG. 13 illustrates, for example, how a plurality of TRMs 1202 using the RFPA 400 could be configured in a phased array 1300. The high phase stiffness property of the RFPA 400 and the lack of need for a circulator (or other isolating device) in the transmit path of the TRM 1302 allows the RFPA 400 in each TRM 1302 to be directly coupled to its designated antenna element 1304 (compare FIG. 13 to FIG. 1). (Note that the TX/RX switch 1306 in each TRM 1302 is employed to isolate the receive path from the transmit path during times when the TRM 1302 is transmitting.) Since the RFPA 400 has high phase stiffness, there is no need to decouple the RFPA 400 from the antenna element 1304 when the TRM 1302 is receiving, although it could be, if desired. (It should be mentioned that, although not shown in this simplified drawing, each TRM 1302 will typically include transmit-path and receive-path phase shifters (or a single phase shifter shared by both paths)). Because the RFPA 400 is a SMPA and its RF output power is dependent on it drain power supply voltage $V_{DD}$, the drain power supply in each TRM 1302 can be varied to control the magnitude of the RF output power produced by each TRM 1303, if desired or necessary. Simulations and measurements have shown that the phase stiffness of the RFPA 400 is not adversely affected by variances in the drain supply voltage $V_{DD}$. (Note that this mode of power control is not available in the conventional TRM 100 since the RF power produced by its linear HPA 112 is independent of the HPA's drain supply voltage.)

Figure 14:
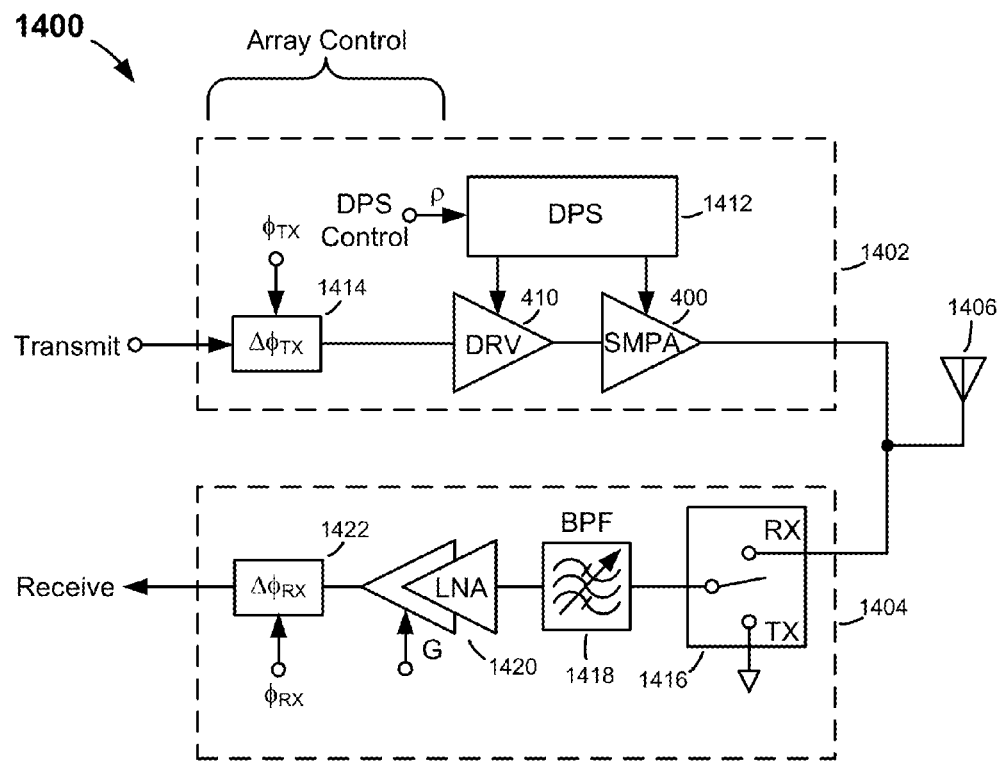
FIG. 14 is a drawing illustrating how the RFPA depicted in FIG. 4 can be employed in a "universal" TRM.

The extraordinary phase stiffness of the RFPA 400 also makes it an excellent candidate for use in the "Universal Transmit-Receive (UTR) Module" disclosed and described in commonly owned and assigned U.S. patent application Ser. No. 14/748,221, entitled "Universal Transmit/Receive Module for Radar and Communications," which is incorporated herein by reference. FIG. 14 here illustrates how the RFPA 400 of the present invention may be used to implement the SMPA of the UTR module described in the Ser. No. 14/748,221 application. As shown in FIG. 14 here, the UTR module 1400 includes a transmit path 1402, a receive path 1404, and an antenna element 1406, which is shared by the transmit and receive paths 1402 and 1404. The transmit path 1402 includes the RFPA 400 (see FIG. 4 above) with its output directly coupled (direct connection or via an AC coupling capacitor) to the antenna element 1406, for example, via a low-loss (e.g., 50Ω) path; a driver 410 (corresponding to the driver 410 in FIG. 4); a dynamic power supply (DPS) 1412; and a transmit-path phase shifter 1414 (or adjustable time delay device). The receive path 1404 includes a transmit/receive (TX/RX) switch 1416; a tunable band-pass filter (BPF) 1418; a low-noise amplifier (LNA) 1420; and a receive-path phase shifter 1422 (or adjustable time delay device). Further details about the operational aspects and characteristics of the various elements making up the UTR module 1400 and the versatility and numerous performance advantages the UTR module 1400 has over prior art TRMs may be found by referring to the Ser. No. 14/748,221 application. Some of these performance advantages will be summarized below.

Figure 15:
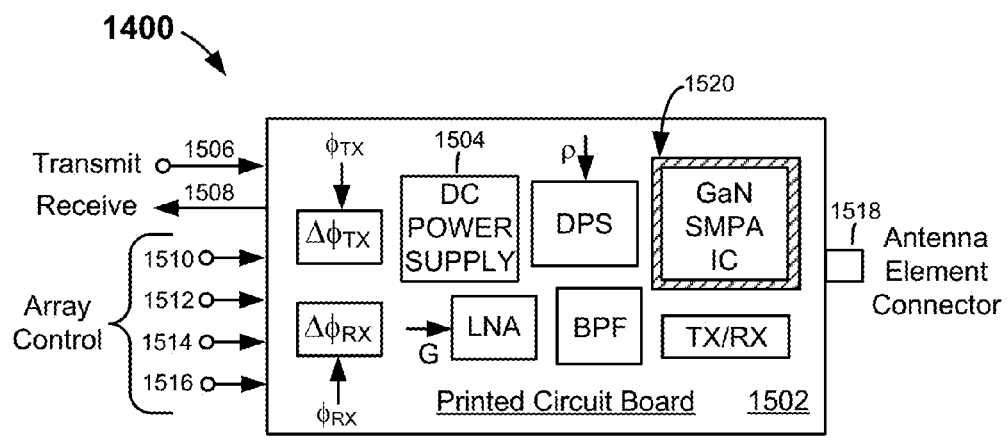
FIG. 15 is a drawing illustrating how the "universal" TRM depicted in FIG. 14 can be formed on a printed circuit board.

The various components of the UTR module 1400 are preferably mounted on a PCB 1502, as illustrated in FIG. 15. The PCB 1502 includes, in addition to the transmit and receive path components, conducting traces (not shown) on either or both sides of the PCB 1502 or, alternatively, in various conducting layers laminated in the PCB 1502. The conducting traces provide the electrical connections that electrically connect the various components of the UTR module 1400 to one another. To support high frequency applications, some or all of the conducting traces may be implemented as microstrip or stripline transmission lines, which serve as high-frequency waveguides. Note that the various components of the UTR module 1400 need not be arranged in the positions shown in FIG. 15, and are not drawn to scale. The drawing is provided to merely emphasize that in a preferred embodiment of the invention the various components of the UTR module 1400 are mounted, in some way, on a PCB 1502. In addition to the components of the UTR module 1400 shown in FIG. 14, one or more DC power supply chips 1504 may be mounted on the PCB 1502 to supply DC power to the UTR module components. Alternatively or additionally, one or more alternative or additional external DC power supplies can be used to supply DC power to the components on the PCB 1502 that require DC power. The PCB 1502 further includes input/output (I/O) terminals 1506 and 1508 for inputting/outputting the RF transmit and receive signals, which depending on the application, may or may not be modulated with information. The array control terminals include first and second phase-adjust input terminals 1510 and 1512 that are configured to receive transmit-path and receive-path phase shift control signals $\phi_{TX}$ and $\phi_{RX}$ for setting and controlling the phase shifts $\Delta\phi_{TX}$ and $\Delta\phi_{RX}$ of the transmit-path and receive-path phase shifters 1414 and 1422, a gain input terminal 1514 configured to receive a gain control signal that sets and controls the gain G of the LNA 1420, and a DPS control terminal 1516 that is configured to receive the DPS control signal for the control input p of the DPS 1412. The PCB 1502 may further include an antenna element connector port 1518 for receiving the UTR module's antenna element 1406. Alternatively, the antenna element 1406 can be permanently attached to the PCB 1502 or formed on or as part of the PCB 1502 itself.

Figure 1:
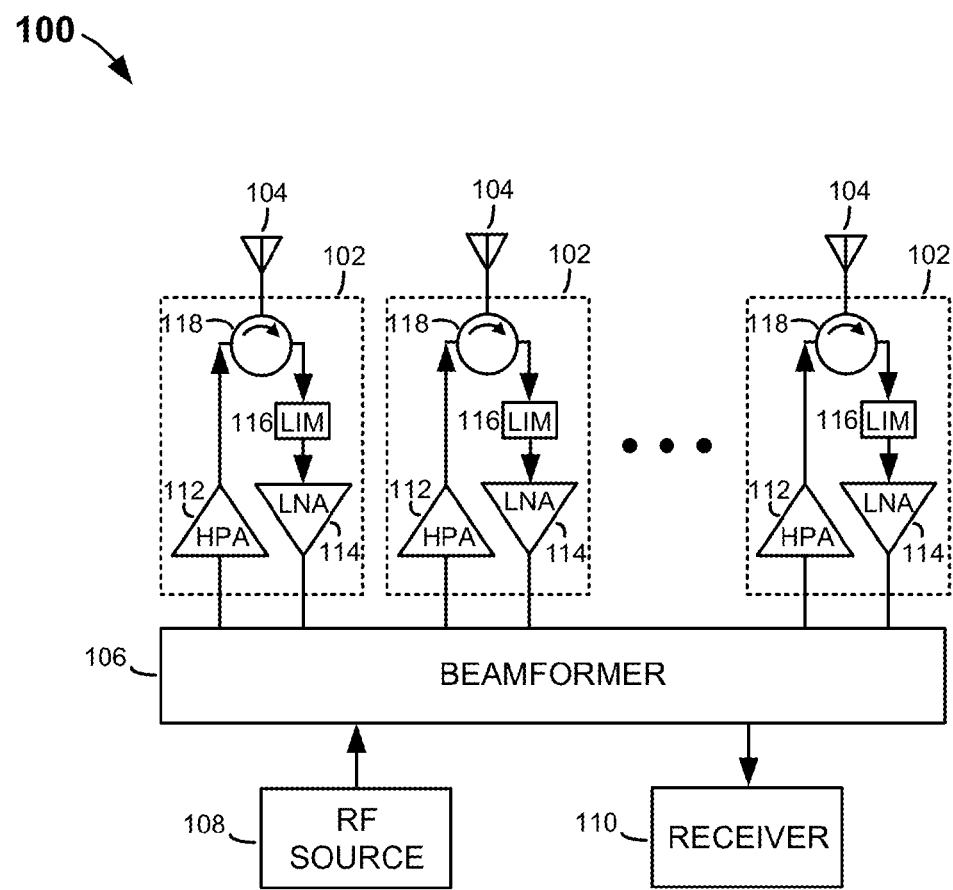
FIG. 1 is a drawing illustrating a plurality of conventional transmit-receive modules (TRMs) configured in a phased array.
Figure 2A:
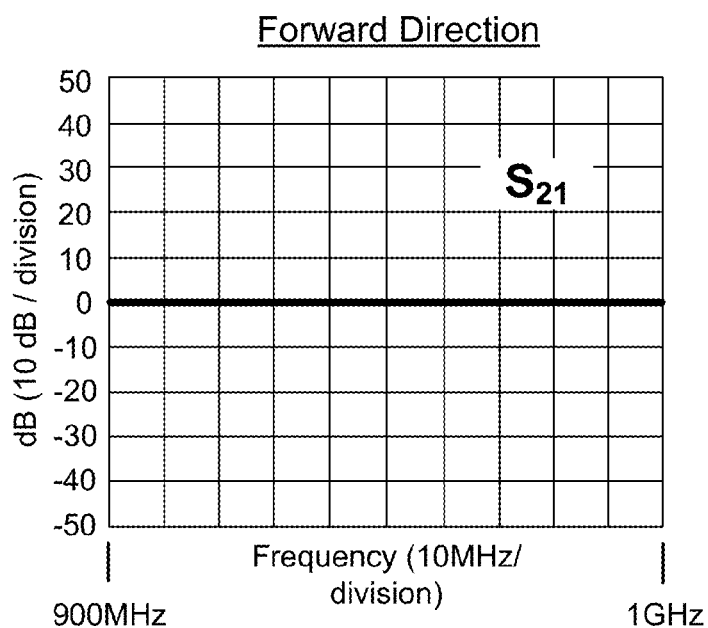
FIGS. 2A and 2B are screen shot measurements of the forward transfer coefficient $s_{21}$ of a typical isolator (FIG. 2A) used in conventional transmit-receive (TR) modules and the reverse transfer coefficient $s_{12}$ of the same isolator.
Figure 2B:
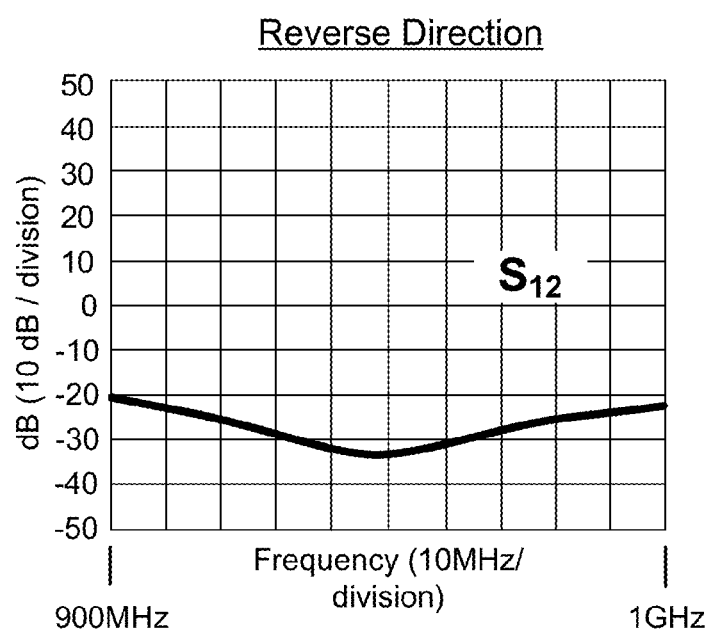
Figure 3:
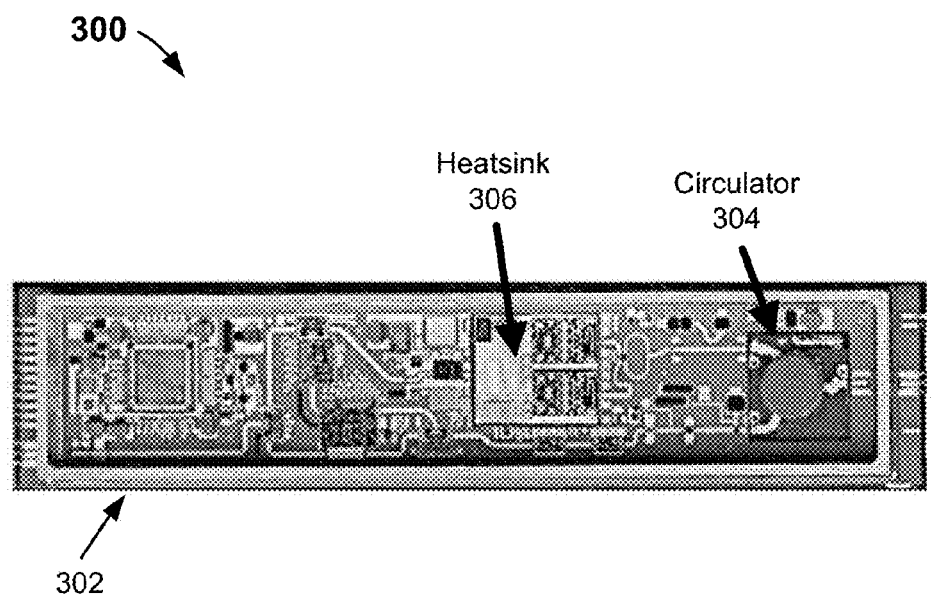
FIG. 3 is a reproduction of a photographic of a conventional TRM commonly used in a phased array.

In addition to the superior phase stiffness of the RFPA 400, which allows the UTR module 1400 to be designed without the need for a circulator or other isolating device, another very important advantage is that by using the RFPA 400 the UTR module 1400 is substantially more energy efficient compared to the conventional TRM 100 (see FIG. 1). The much higher energy efficiency is due to the fact that the RFPA 400 is configured to operate as a switch, while the HPA 112 in the conventional TRM 100 is not, but rather is configured to operate as a controlled current source, i.e., as a Class A, B, AB or C RFPA.

Eliminating the need for a circulator and employing the switch-based RFPA 400 in the UTR module 1400 provides a further advantage of constructing a phased array having a substantially better SWaP (Size, Weight and Power) performance than can be possibly realized in a phased array constructed from conventional TRMs. Phased arrays will often employ hundreds and sometimes thousands of TRMs. Accordingly, the SWaP performance of each TRM is a major factor in determining the SWaP performance of the phased array as a whole. Since the RFPA 400 in each UTR module 1400 can operate with high efficiency and the high phase stiffness provided by the RFPA 400 obviates the need for a circulator or other isolating device on the UTR module 1400, the UTR module 1400 can be made much smaller and much lighter than the conventional TRM 100. The size and weight of the phased array as a whole will also, as a consequence, be much smaller and lighter compared to a phased array built from conventional TRMs 100.

The SWaP performance of each UTR module 1400 and consequently the SWaP performance of the phased array as a whole is further improved over conventional approaches by implementing the RFPA 400 and driver 410 in each UTR module 1400 as a GaN-based MMIC. GaN has a high power density, thus allowing the GaN-based driver 410 and GaN-based RFPA 400 to be fabricated in a compact IC, packaged in a much smaller form factor than required for a conventional driver/linear RFPA, and allowing a much smaller heatsink 1520 to be used.

Finally, the superior efficiency of the UTR modules 1400 brought about by using the RFPA 400 improves SWaP performance by allowing much smaller and lighter power supplies to be used to power the phased array, and minimizes the size and weight of fans and other cooling systems that may be needed to displace heat generated by the array. Taking all of these advantages into consideration, it is clear that the SWaP performance of a phased array constructed from UTR modules 1400, or other TRMs using the phase-stiff RFPA 400 of the present invention, will exhibit a vastly superior SWaP performance than can be possibly realized in a phased array constructed from conventional TRMs.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A switch-mode radio frequency power amplifier (RFPA), comprising:
a power transistor having an input terminal configured to receive an RF switch drive signal that switches the power transistor between on and off states and an output terminal configured to supply RF power to a load; and
a phase-stiffness-enhancing device coupled to the output terminal of the power transistor having an impedance that reduces an effective output reflection coefficient of the switch-mode RFPA and enhances a phase stiffness of the switch-mode RFPA, said effective output reflection coefficient being proportional to a sum of an output reflection coefficient of the switch-mode RFPA when the power transistor is switched on and an output reflection coefficient of the switch-mode RFPA when the power transistor is switched off.

2. The switch-mode RFPA of claim 1, wherein an impedance of the phase-stiffness-enhancing device is set so that the effective output reflection coefficient of the switch-mode RFPA is minimized to as close to zero as possible.

3. The switch-mode RFPA of claim 1, wherein the phase-stiffness-enhancing device comprises a phase-stiffness-enhancing resistor.

4. The switch-mode RFPA of claim 3, wherein the load has a characteristic impedance $Z_0$ and the resistance of the phase-stiffness-enhancing resistor is set so that it is greater than a magnitude of the characteristic impedance $Z_0$.

5. The switch-mode RFPA of claim 3, wherein the load has a characteristic impedance $Z_0$ and the resistance of the phase-stiffness-enhancing resistor is set so that it is greater than or equal to $Z_0^2/R_{ON}$, where $R_{ON}$ is the output resistance of the switch-mode RFPA when the power transistor is switched on.

6. The switch-mode RFPA of claim 1, further comprising an inductor having a first terminal connected to the output terminal of the power transistor and a second terminal configured to receive a power supply voltage that affects the magnitude of the RF output power produced by the power transistor.

7. The switch-mode RFPA of claim 6, wherein the received power supply voltage is a dynamic power supply (DPS).

8. A method of enhancing a phase stiffness of a switch-mode radio frequency power amplifier (RFPA), comprising:
configuring a switch-mode radio frequency power amplifier (RFPA) to switch between two distinct states, an ON state and an OFF state; and
controlling an output impedance of the switch-mode RFPA so that a magnitude of an OFF-state output reflection coefficient when the switch-mode RFPA is in its OFF state is forced to more closely equal a magnitude of an ON-state output reflection coefficient when the switch-mode RFPA is in its ON state and thereby enhance a phase stiffness of the switch-mode RFPA beyond its natural or built-in phase stiffness.

9. The method of claim 8, wherein controlling the output impedance of the switch-mode RFPA comprises coupling a phase-stiffness-enhancing impedance to an output of the switch-mode RFPA that forces the output impedance of the switch-mode RFPA in the OFF state to substantially equal the phase-stiffness-enhancing impedance.

10. The method of claim 9, wherein the phase-stiffness-enhancing impedance is set so that an effective output reflection coefficient of the switch-mode RFPA is minimized to as close to zero as possible, said effective output reflection coefficient being an average of the output impedance of the switch-mode RFPA when in its OFF state and the output impedance of the switch-mode RFPA when in its ON state.

11. The method of claim 9, wherein controlling the output impedance of the switch-mode RFPA comprises setting the phase-stiffness-enhancing impedance so that it is greater than an impedance of a load to which the switch-mode RFPA is configured to deliver RF power.

12. The method of claim 11, wherein the load has a characteristic impedance $Z_0$ and setting the phase-stiffness-enhancing impedance includes setting the phase-stiffness-enhancing impedance so that it is greater than or equal to $Z_0^2/R_{ON}$, where $R_{ON}$ represents the ON-state output resistance of the switch-mode RFPA.

13. The method of claim 8, wherein the switch-mode RFPA is configured to be powered by a dynamic power supply (DPS).

14. The switch-mode RFPA of claim 1, wherein the impedance of the phase-stiffness-enhancing device is set so that a magnitude of the output reflection coefficient of the switch-mode RFPA when switched off is equal to or approximately equal to a magnitude of the output reflection coefficient of the switch-mode RFPA when switched on.

15. The switch-mode RFPA of claim 1, wherein an impedance of the phase-stiffness-enhancing device is set so that a product of an on-state output impedance of the switch-mode RFPA and an off-state output impedance of the switch-mode RFPA is approximately equal to the square of a characteristic impedance.

16. The switch-mode RFPA of claim 1, wherein an impedance of the phase-stiffness-enhancing device is set so that it lowers but does not necessarily minimize the effective output reflection coefficient of the switch-mode RFPA so that a desired combination of phase-stiffness bandwidth and phase stiffness can be realized.

17. A method of making a switch-mode radio frequency power amplifier (RFPA) less susceptible to producing a distorted electromagnetic wave output when in the presence of a disturbing electromagnetic wave, comprising:
generating a desired electromagnetic wave at an output of the switch-mode RFPA; and
controlling an output impedance of the switch-mode RFPA so that the switch-mode RFPA is simultaneously less susceptible to absorbing energy from a disturbing electromagnetic wave and less susceptible to reflecting a fundamental component of the disturbing electromagnetic wave from its output.

18. The method of claim 17, wherein controlling the output impedance of the switch-mode RFPA comprises setting the output impedance of the switch-mode RFPA so that a phase excursion of the desired electromagnetic wave in the presence of the disturbing electromagnetic wave is reduced or is minimized.

19. The method of claim 17, wherein controlling the output impedance of the switch-mode RFPA comprises setting the output impedance of the switch-mode RFPA so that an effective output reflection coefficient of the switch-mode RFPA is reduced in value or is minimized, the effective output reflection coefficient being the average of an output reflection coefficient of the switch-mode RFPA when switched on and an output reflection coefficient of the switch-mode RFPA when switched off.

20. The method of claim 17, wherein controlling the output impedance of the switch-mode RFPA comprises coupling a phase-stiffness-enhancing impedance to the output of the switch-mode RFPA, the phase-stiffness-enhancing impedance substantially determining what the output impedance of the switch-mode RFPA is when in its off state without substantially affecting the output impedance of the switch-mode RFPA when in its on state.

21. The method of claim 20, wherein the phase-stiffness-enhancing impedance is set so that it is greater than or equal to $Z_0^2/R_{ON}$, where $Z_0$ is a characteristic impedance and $R_{ON}$ is the output resistance of the switch-mode RFPA when switched on.

22. The method of claim 20, wherein the switch-mode RFPA is configured to deliver RF power to a load having a characteristic impedance and the resistance of the phase-stiffness-enhancing resistor is set so that it is greater than a magnitude of the characteristic impedance.

23. The method of claim 20, wherein the phase-stiffness-enhancing impedance is set so that it lowers but does not necessarily minimize the effective output reflection coefficient of the switch-mode RFPA so that a desired combination of phase-stiffness bandwidth and phase stiffness is realized.

* * * * *